United States Patent
Grunzke

(10) Patent No.: US 9,990,971 B2
(45) Date of Patent: Jun. 5, 2018

(54) DEVICES, METHODS, AND SYSTEMS SUPPORTING ON UNIT TERMINATION

(71) Applicant: Micron Technology, Inc., Boise, ID (US)

(72) Inventor: Terry M. Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 160 days.

(21) Appl. No.: 14/959,140

(22) Filed: Dec. 4, 2015

(65) Prior Publication Data

US 2016/0093348 A1    Mar. 31, 2016

Related U.S. Application Data

(63) Continuation of application No. 13/192,125, filed on Jul. 27, 2011, now Pat. No. 9,224,430.

(51) Int. Cl.
| | |
|---|---|
| G11C 7/22 | (2006.01) |
| G11C 5/04 | (2006.01) |
| G11C 29/02 | (2006.01) |
| G06F 13/16 | (2006.01) |

(52) U.S. Cl.
CPC ............ *G11C 7/22* (2013.01); *G06F 13/1668* (2013.01); *G11C 5/04* (2013.01); *G11C 29/025* (2013.01); *G11C 29/028* (2013.01); *Y02D 10/14* (2018.01)

(58) Field of Classification Search
CPC ... G06F 13/4086; G11C 29/02; G11C 29/025; G11C 29/028; G11C 29/50008; G11C 5/04; G11C 5/06; G11C 5/063; G11C 5/14; G11C 5/144; G11C 7/1048; G11C 7/1051; G11C 7/1057; G11C 7/20; G11C 8/04; G11C 8/18; H03K 19/0005; H03K 19/01721; H03K 19/0941; H04L 25/0278; H04L 25/0298
USPC ......................................................... 326/30
See application file for complete search history.

(56) References Cited

U.S. PATENT DOCUMENTS

| | | | |
|---|---|---|---|
| 6,373,276 B1 | 4/2002 | Hui | |
| 6,630,845 B2 | 10/2003 | Boucher | |
| 7,342,411 B2* | 3/2008 | Vergis | .................... G11C 5/063 |
| | | | 326/30 |
| 7,671,622 B2 | 3/2010 | Oh et al. | |
| 7,688,104 B2 | 3/2010 | Park | |
| 7,948,262 B2 | 5/2011 | Nguyen | |
| 7,952,944 B2 | 5/2011 | Kim et al. | |
| 2004/0071040 A1 | 4/2004 | Funaba et al. | |
| 2005/0024098 A1 | 2/2005 | Nguyen | |
| 2005/0162184 A1 | 7/2005 | Shibata et al. | |
| 2005/0228912 A1* | 10/2005 | Walker | ................ G06F 13/4086 |
| | | | 710/107 |

(Continued)

OTHER PUBLICATIONS

Grunzke, Terry. "ONFi 3.0: The Path to 400MT/s NAND Interface Speeds," Flash Memory Summit, Santa Clara, CA, Aug. 2010 (17 pages).

*Primary Examiner* — Alexander H Taningco
*Assistant Examiner* — Seokjin Kim
(74) *Attorney, Agent, or Firm* — Brooks, Cameron & Huebsch, PLLC

(57) ABSTRACT

The present disclosure includes devices, methods, and systems supporting on unit termination. A number of embodiments include a number of memory units, wherein a memory unit includes termination circuitry, and a memory unit does not include termination circuitry.

20 Claims, 5 Drawing Sheets

(56) References Cited

U.S. PATENT DOCUMENTS

| | | |
|---|---|---|
| 2005/0264316 A1* | 12/2005 | Atkinson ............ G06F 13/4072 |
| | | 326/30 |
| 2006/0099926 A1 | 5/2006 | Broyde et al. |
| 2007/0035326 A1 | 2/2007 | Braun et al. |
| 2007/0080707 A1 | 4/2007 | Brinkman et al. |
| 2007/0081376 A1 | 4/2007 | Funaba et al. |
| 2008/0001623 A1 | 1/2008 | Kim |
| 2008/0040624 A1 | 2/2008 | Wilcox |
| 2008/0088338 A1 | 4/2008 | Kim |
| 2008/0258768 A1 | 10/2008 | Sreeramaneni |
| 2009/0016124 A1 | 1/2009 | Kim |
| 2009/0052235 A1 | 2/2009 | Horii et al. |
| 2009/0066363 A1 | 3/2009 | Kim et al. |
| 2009/0085604 A1 | 4/2009 | David |
| 2010/0182817 A1* | 7/2010 | Koshizuka ............... G11C 5/04 |
| | | 365/51 |
| 2010/0208534 A1 | 8/2010 | Fujisawa |
| 2010/0253446 A1 | 10/2010 | Broyde et al. |
| 2011/0016266 A1* | 1/2011 | Asano .................... G11C 5/005 |
| | | 711/103 |
| 2011/0025284 A1 | 2/2011 | Xu et al. |
| 2011/0109344 A1 | 5/2011 | Choi et al. |
| 2011/0140754 A1 | 6/2011 | Tokunaga et al. |

* cited by examiner

DEVICES, METHODS, AND SYSTEMS SUPPORTING ON UNIT TERMINATION

PRIORITY INFORMATION

This application is a Continuation of U.S. application Ser. No. 13/192,125, filed Jul. 27, 2011, the contents of which are incorporated herein by reference.

TECHNICAL FIELD

The present disclosure relates generally to semiconductor memory devices, methods, and systems, and more particularly, to devices, methods, and systems supporting on unit termination.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its information and can include random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM), among others.

Memory devices can be combined together to form a solid state drive (SSD). A solid state drive can include non-volatile memory (e.g., NAND flash memory and/or NOR flash memory), and/or can include volatile memory (e.g., DRAM and/or SRAM), among various other types of non-volatile and volatile memory. An SSD can be used to replace hard disk drives as the main storage device for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can include one or more discrete memory devices (e.g., packages), which can be multi-chip packages (MCPs). An MCP can include a number of memory units, which can be a number of memory dies and/or chips. The memory units can execute commands received from a host, report status to the host, and/or can include one or more memory arrays along with peripheral circuitry. The memory arrays can include memory cells that can be organized into a number of physical groups (e.g., blocks), with each of the groups capable of storing multiple pages of data.

The memory devices of an SSD can have on unit termination capabilities, which is referred to hereinafter by example as on die termination (ODT) capabilities. ODT can refer to the use of a number of memory units (e.g., die) of a memory device to perform termination for a number of signal lines of a shared bus associated with the memory device.

ODT can improve signal integrity associated with signals across shared busses. However, previous ODT approaches can increase the input/output capacitance (CIO) of the die, which can decrease the operational speed (e.g., the input/output speed) of the memory device. Additionally, previous ODT approaches can increase the power consumption of the memory device.

DETAILED DESCRIPTION

Figure 1:
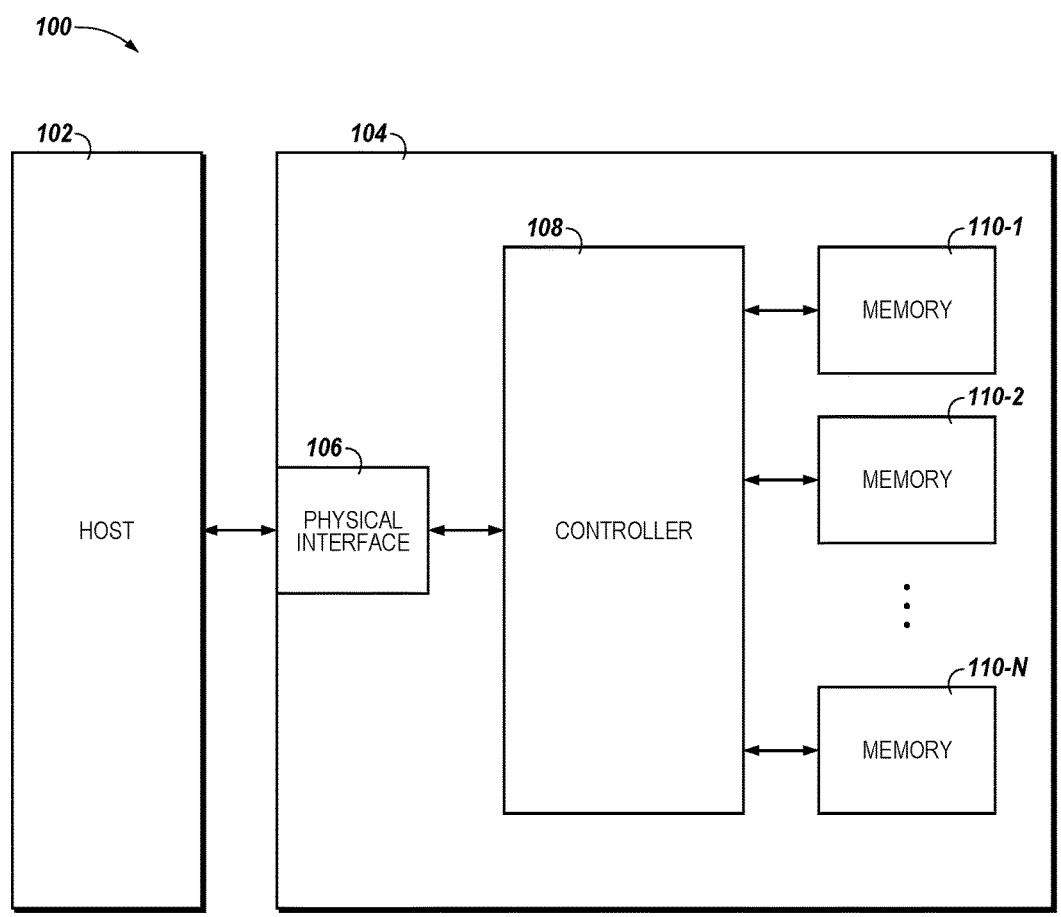
FIG. 1 is a functional block diagram of a computing system including at least one memory system in accordance with a number of embodiments of the present disclosure.

The present disclosure includes devices, methods, and systems supporting on unit termination. A number of embodiments include a number of memory units, wherein a memory unit includes termination circuitry, and a memory unit does not include termination circuitry.

Devices, methods, and/or systems (e.g., memory devices and/or memory systems) supporting on die termination (ODT) in accordance with a number of embodiments of the present disclosure may have decreased input/output capacitance (CIO), and hence increased operational speed (e.g., increased input/output speed), as compared to devices, methods, and/or systems supporting ODT in accordance with previous approaches. Additionally, devices, methods, and/or systems supporting ODT in accordance with a number of embodiments of the present disclosure may have decreased power consumption and/or decreased latency as compared to devices, methods, and/or systems supporting ODT in accordance with previous approaches.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designator "N" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a functional block diagram of a computing system 100 including at least one memory system 104 in accordance with a number of embodiments of the present disclosure. Memory system 104 can be, for example, a solid state drive (SSD). In the embodiment illustrated in FIG. 1, memory system 104 includes a physical host interface 106, a number of memory devices 110-1, 110-2, . . . , 110-N (e.g., solid state memory devices), and a controller 108 (e.g., an SSD controller) coupled to physical host interface 106 and memory devices 110-1, 110-2, . . . , 110-N.

Physical host interface 106 can be used to communicate information between memory system 104 and another device such as a host 102. Host 102 can include a memory access device (e.g., a processor). One of ordinary skill in the art will appreciate that "a processor" can intend a number of processors, such as a parallel processing system, a number of coprocessors, etc. Example hosts can include laptop computers, personal computers, digital cameras, digital recording and playback devices, mobile telephones, PDAs, memory card readers, interface hubs, and the like.

Physical host interface 106 can be in the form of a standardized physical interface. For example, when memory system 104 is used for information storage in computing system 100, physical host interface 106 can be a serial advanced technology attachment (SATA) physical interface, a peripheral component interconnect express (PCIe) physical interface, or a universal serial bus (USB) physical interface, among other physical connectors and/or interfaces. In general, however, physical host interface 106 can provide an interface for passing control, address, information (e.g., data), and other signals between memory system 104 and a host (e.g., host 102) having compatible receptors for physical host interface 106.

Controller 108 can include, for example, control circuitry and/or firmware. Controller 108 can be included on the same physical device (e.g., the same die) as memory devices 110-1, 110-2, . . . , 110-N. For example, controller 108 can be an application specific integrated circuit (ASIC) coupled to a printed circuit board including physical host interface 106 and memory devices 110-1, 110-2, . . . , 110-N. Alternatively, controller 108 can be included on a separate physical device that is communicatively coupled to the physical device that includes memory devices 110-1, 110-2, . . . , 110-N.

Controller 108 can communicate with memory devices 110-1, 110-2, . . . , 110-N to sense (e.g., read), program (e.g., write), and/or erase information, among other operations. Controller 108 can have circuitry that may be a number of integrated circuits and/or discrete components. In a number of embodiments, the circuitry in controller 108 may include control circuitry for controlling access across memory devices 110-1, 110-2, . . . , 110-N and/or circuitry for providing a translation layer between host 102 and memory system 104. Controller 108 will be further described herein (e.g., in connection with FIGS. 2-5).

Memory devices 110-1, 110-2, . . . , 110-N can include, for example, a number of non-volatile memory arrays (e.g., arrays of non-volatile memory cells). For instance, memory devices 110-1, 110-2, . . . , 110-N can be flash devices with a NAND architecture. In a NAND architecture, the control gates of memory cells of a "row" can be coupled with an access (e.g., word) line, while the memory cells can be coupled in series source to drain in a "string" between a select gate source transistor and a select gate drain transistor. The string can be connected to a data (e.g., bit) line by the select gate drain transistor. The use of the terms "row" and "string" implies neither a linear nor an orthogonal arrangement of memory cells. As will be appreciated by those of ordinary skill in the art, the manner of connection of the memory cells to the bit lines and source lines depends on whether the array is a NAND architecture, a NOR architecture, or some other memory array architecture.

The memory arrays of memory devices 110-1, 110-2, . . . , 110-N can include a number of memory cells that can be grouped. As used herein, a group can include a number of memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4320 bytes of information per page, 128 pages per block, 2048 blocks per plane, and 16 planes per device.

Memory devices 110-1, 110-2, . . . , 110-N will be further described herein (e.g., in connection with FIGS. 2-5). For example, memory devices 110-1, 110-2, . . . , 110-N can include on die termination (ODT) capabilities, as will be further described herein.

Figure 2:
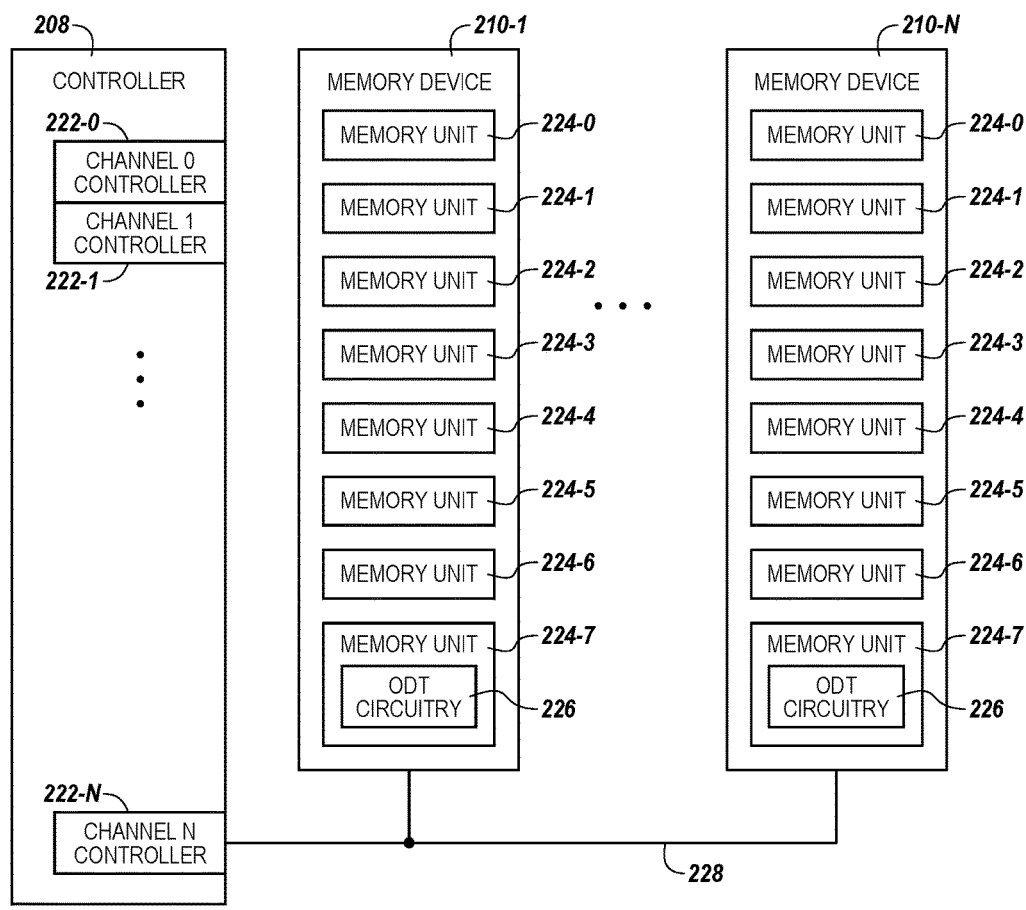
FIG. 2 is a functional block diagram of a portion of a memory system in accordance with a number of embodiments of the present disclosure.

FIG. 2 is a functional block diagram of a portion of a memory system (e.g., memory system 104 previously described in connection with FIG. 1) in accordance with a number of embodiments of the present disclosure. The memory system illustrated in FIG. 2 includes a controller 208 coupled to a number of memory devices 210-1, . . . , 210-N via a bus 228. Controller 208 and memory devices 210-1, . . . , 210-N can be, for example, controller 108 and memory devices 110-1, . . . , 110-N, respectively, previously described in connection with FIG. 1.

Bus 228 can send and/or receive various signals (e.g., data signals, control signals, and/or address signals) between memory devices 210-1, . . . , 210-N and controller 208. Although the example illustrated in FIG. 2 includes a single bus 228, the memory system can include a separate data bus (DQ bus), control bus, and address bus. Bus 228 can have various types of bus structures including, but not limited to, bus structures related to Open NAND Flash Interface (ONFI), Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

Controller 208 can control access across a number of memory channels. In the embodiment illustrated in FIG. 2, controller 208 includes a number of channel controllers 222-0, 222-1, . . . , 222-N each controlling access to a respective memory channel. For example, in the embodiment illustrated in FIG. 2, channel controller 222-N is coupled to memory devices 210-1, . . . , 210-N via bus 228.

As shown in FIG. 2, memory devices 210-1, . . . , 210-N can include a number of (e.g., eight) memory units 224-0 to 224-7 that can provide a storage volume for the memory system. Memory units 224-0 to 224-7 can be dies or chips, for example, and can be referred to as logical units (LUNs). As such, memory devices 210-1, . . . , 210-N can be multi-chip packages (MCPs) that include a number of dies 224-0 to 224-7 (e.g., NAND dies). Memory units 224-0 to 224-7 can include one or more arrays of memory cells. For example, memory units 224-0 to 224-7 can include flash arrays having a NAND architecture. However, embodiments of the present disclosure are not limited to the example shown in FIG. 2. For instance, memory systems in accordance with embodiments of the present disclosure can include more or less than eight memory units (e.g., die) per memory device (e.g., MCP) and are not limited to a particular memory array type (e.g., NAND flash, NOR flash, DRAM, etc.). Further, different memory devices of the memory system can include memory units of different types.

As shown in FIG. 2, at least one of memory units 224-0 to 224-7 of memory devices 210-1, . . . , 210-N includes on die termination (ODT) circuitry, and at least one of memory units 224-0 to 224-7 does not include ODT circuitry. For example, in the embodiment illustrated in FIG. 2, only memory unit 224-7 includes ODT circuitry 226 (e.g., none of memory units 224-0 to 224-6 include ODT circuitry).

ODT can refer to the use of a number of memory units (e.g., die) of a memory device to perform termination for a number of signal lines of a shared bus associated with the memory device. That is, ODT circuitry 226 of memory unit 224-7 can perform termination for a number of signal lines of bus 228 associated with memory devices 210-1, . . . , 210-N. For instance, ODT circuitry 226 can include a number of resistors (e.g., a number of different selectable resistors) that can terminate (e.g., impede) a signal across bus 228. ODT can improve signal integrity associated with signals across shared busses, for instance.

As an example, ODT circuitry 226 (e.g., memory unit 224-7) can be used (e.g., assigned) as a terminator for a particular memory unit (e.g., a target memory unit 224-0 to 224-7 of memory devices 210-1, . . . , 210-N) such that ODT circuitry 226 performs termination functions when the particular memory unit is selected in association with a memory operation. As an example, ODT circuitry 226 can enter a sniff state in which it monitors commands provided across bus 228. ODT circuitry 226 can activate upon detection of a particular command (e.g., a read command, a write command, etc.) and/or address provided to a target memory unit, and/or upon detection of a particular address in the target memory unit, in order to perform a termination function (e.g., terminate a signal across bus 228). ODT circuitry 226 can then return to a sniff state such that it does not remain active.

In a number of embodiments, a memory unit that includes ODT circuitry may have a higher input/output capacitance (CIO) than a memory unit that does not include ODT circuitry. Accordingly, because none of memory units 224-0 to 224-6 include ODT circuitry, memory units 224-0 to 224-6 may have a lower CIO than memory unit 224-7. The lower CIO of memory units 224-0 to 224-6 can reduce the capacitance of memory devices 210-1, . . . , 210-N as compared with previous approaches (e.g., approaches in which all memory units of a memory device include enabled or disabled ODT circuitry), and hence can increase the operation speed (e.g., the input/output speed) of memory devices 210-1, . . . , 210-N as compared with previous approaches.

In a number of embodiments, ODT circuitry such as ODT circuitry 226 of memory unit 224-7 can perform non-target termination for sense (e.g., read) operations performed on memory devices 210-1, . . . , 210-N. That is, for sense operations performed on memory devices 210-1, . . . , 210-N, ODT circuitry 226 may be located on a separate memory unit from a target memory unit for which ODT circuitry 226 performs termination. For instance, for sense operations performed on memory devices 210-1, . . . , 210-N, ODT circuitry 226 may perform termination for one or more of memory units 224-0 to 224-6 of memory devices 210-1, . . . , 210-N. That is, memory devices 210-1, . . . , 210-N can support non-target termination during sense operations.

In a number of embodiments, ODT circuitry such as ODT circuitry 226 of memory unit 224-7 can perform target and/or non-target termination for program (e.g., write) operations performed on memory devices 210-1, . . . , 210-N. That is, for program operations performed on memory devices 210-1, . . . , 210-N, ODT circuitry 226 may be located on a separate memory unit from a target memory unit for which ODT circuitry 226 performs termination and/or on the same memory unit as a target memory unit for which ODT circuitry 226 performs termination. For instance, for program operations performed on memory devices 210-1, . . . , 210-N, ODT circuitry 226 may perform termination for one or more memory units 224-0 to 224-7 of memory devices 210-1, . . . , 210-N. That is, memory devices 210-1, . . . , 210-N can support target and/or non-target termination during program operations.

In a number of embodiments, a memory unit that includes ODT circuitry, (e.g., memory unit 224-7) can provide electrostatic discharge (ESD) protection for other memory units of the memory device (e.g., memory device 210-1). That is, memory unit 224-7 can provide shared ESD protection among memory units 224-0 to 224-7. In a number of embodiments, a memory unit that does not include ODT circuitry (e.g., memory units 224-0 to 224-6) can also provide ESD protection for other memory units of the memory device. For example, in a number of embodiments, memory units 224-0 to 224-6 may provide at least comparatively reduced on-die ESD protection for other memory units of the memory device as compared with the ESD protection provided for the other memory units by memory unit 224-7, which can further reduce the CIO of memory units 224-0 to 224-6.

Figure 3:
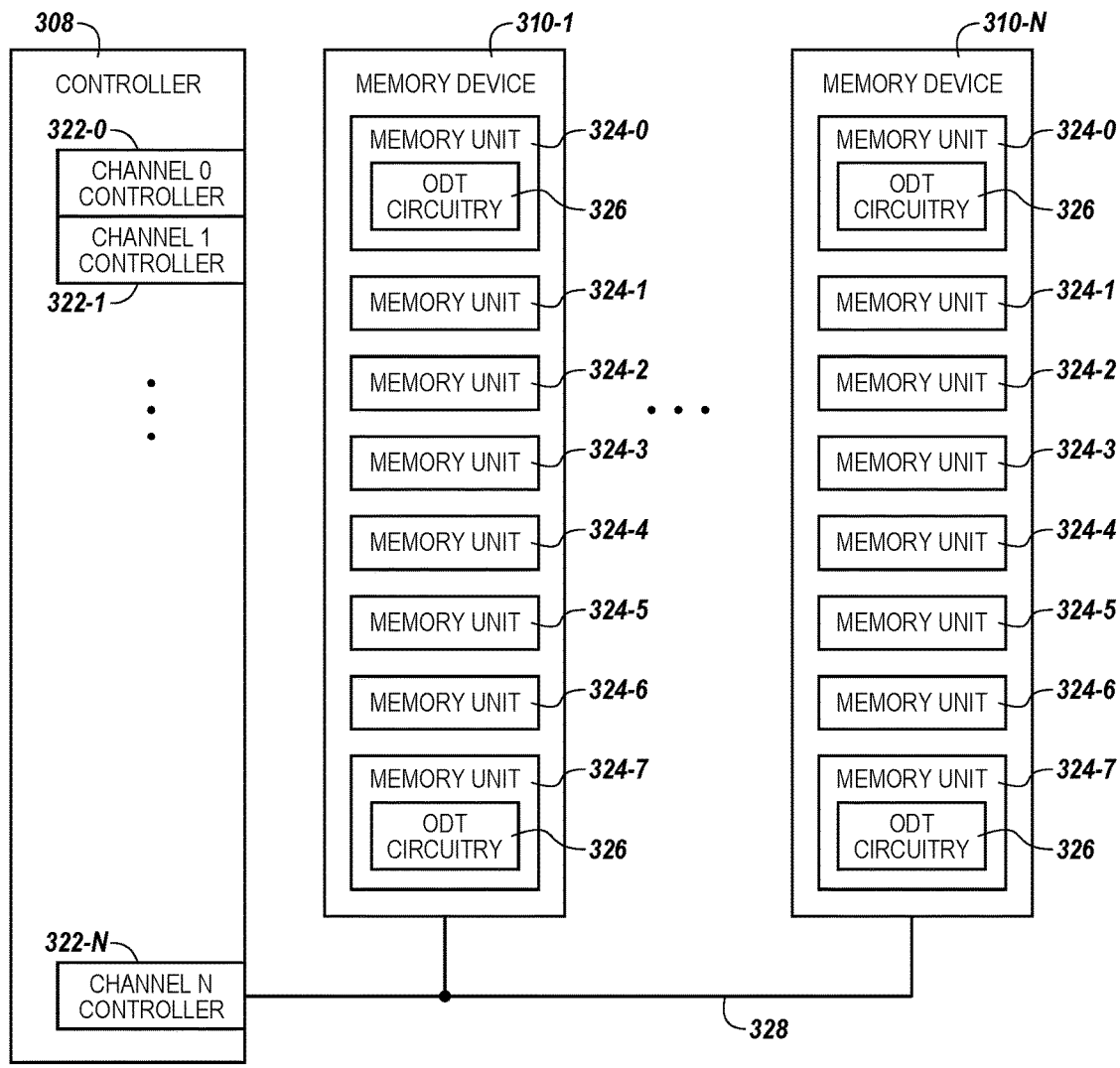
FIG. 3 is a functional block diagram of a portion of a memory system in accordance with a number of embodiments of the present disclosure.

FIG. 3 is a functional block diagram of a portion of a memory system (e.g., memory system 104 previously described in connection with FIG. 1) in accordance with a number of embodiments of the present disclosure. The memory system illustrated in FIG. 3 includes a controller 308 coupled to a number of memory devices 310-1, . . . , 310-N via a bus 328. Controller 308 and memory devices 310-1, . . . , 310-N can be, for example, controller 108 and memory devices 110-1, . . . , 110-N, respectively, previously described in connection with FIG. 1. Bus 328 can be, for example, analogous to bus 228 previously described in connection with FIG. 2.

Controller 308 can control access across a number of memory channels. In the embodiment illustrated in FIG. 3, controller 308 includes a number of channel controllers 322-0, 322-1, . . . , 322-N each controlling access to a respective memory channel. For example, in the embodiment illustrated in FIG. 3, channel controller 322-N is coupled to memory devices 310-1, . . . , 310-N via bus 328.

As shown in FIG. 3, memory devices 310-1, . . . , 310-N can include a number of (e.g., eight) memory units 324-0 to 324-7 that can provide a storage volume for the memory system. Memory units 324-0 to 324-7 can be, for example, analogous to memory units 224-0 to 224-7 previously described in connection with FIG. 2.

As shown in FIG. 3, at least one of memory units 324-0 to 324-7 of memory devices 310-1, . . . , 310-N includes on die termination (ODT) circuitry, and at least one of memory units 324-0 to 324-7 does not include ODT circuitry. For example, in the embodiment illustrated in FIG. 3, only memory units 324-0 and 324-7 include ODT circuitry 326 (e.g., none of memory units 324-1 to 324-6 include ODT circuitry).

ODT circuitry 326 can be analogous to ODT circuitry 226 previously described in connection with FIG. 2. For example, ODT circuitry 326 of memory units 324-0 and/or 324-7 can perform termination for a number of signal lines of bus 328 associated with memory devices 310-1, . . . , 310-N in a manner analogous to that previously described in connection with FIG. 2.

As previously described herein, a memory unit that includes ODT circuitry may have a higher input/output capacitance (CIO) than a memory unit that does not include ODT circuitry. Accordingly, because none of memory units 324-1 to 324-6 include ODT circuitry, memory units 324-1 to 324-6 may have a lower CIO than memory units 324-0 and/or 324-7. The lower CIO of memory units 324-1 to 324-6 can reduce the capacitance of memory devices 310-1, . . . , 310-N as compared with previous approaches (e.g., approaches in which all memory units of a memory device include enabled or disabled ODT circuitry), and hence can increase the operation speed (e.g., the input/output speed) of memory devices 310-1, . . . , 310-N as compared with previous approaches.

In a number of embodiments, for sense (e.g., read) and/or program (e.g., write) operations performed on memory devices 310-1, . . . , 310-N, one of memory units 324-0 and 324-7 that includes ODT circuitry 326 can be used to perform non-target termination, and the other one of memory units 324-0 and 324-7 that includes ODT circuitry 326 can be used to perform target termination. That is, for sense and/or program operations performed on memory devices 310-1, . . . , 310-N, the ODT circuitry 326 of one of memory units 324-0 and 324-7 may be located on a separate memory unit from a target memory unit for which that ODT circuitry 326 performs termination, and the ODT circuitry 326 of the other one of memory units 324-0 and 324-7 may be located on the same memory unit as a target memory unit for which that ODT circuitry 326 performs termination. For instance, for sense and/or program operations performed on memory devices 310-1, . . . , 310-N, ODT circuitry 326 of memory unit 324-0 can be assigned as the terminator for memory units 324-1 to 324-7 (e.g., memory units other than memory unit 324-0), and ODT circuitry 326 of memory unit 324-7 can be assigned as the terminator for memory unit 324-7. That is, memory devices 310-1, . . . , 310-N can support target and/or non-target termination during sense and/or program operations.

Figure 4:
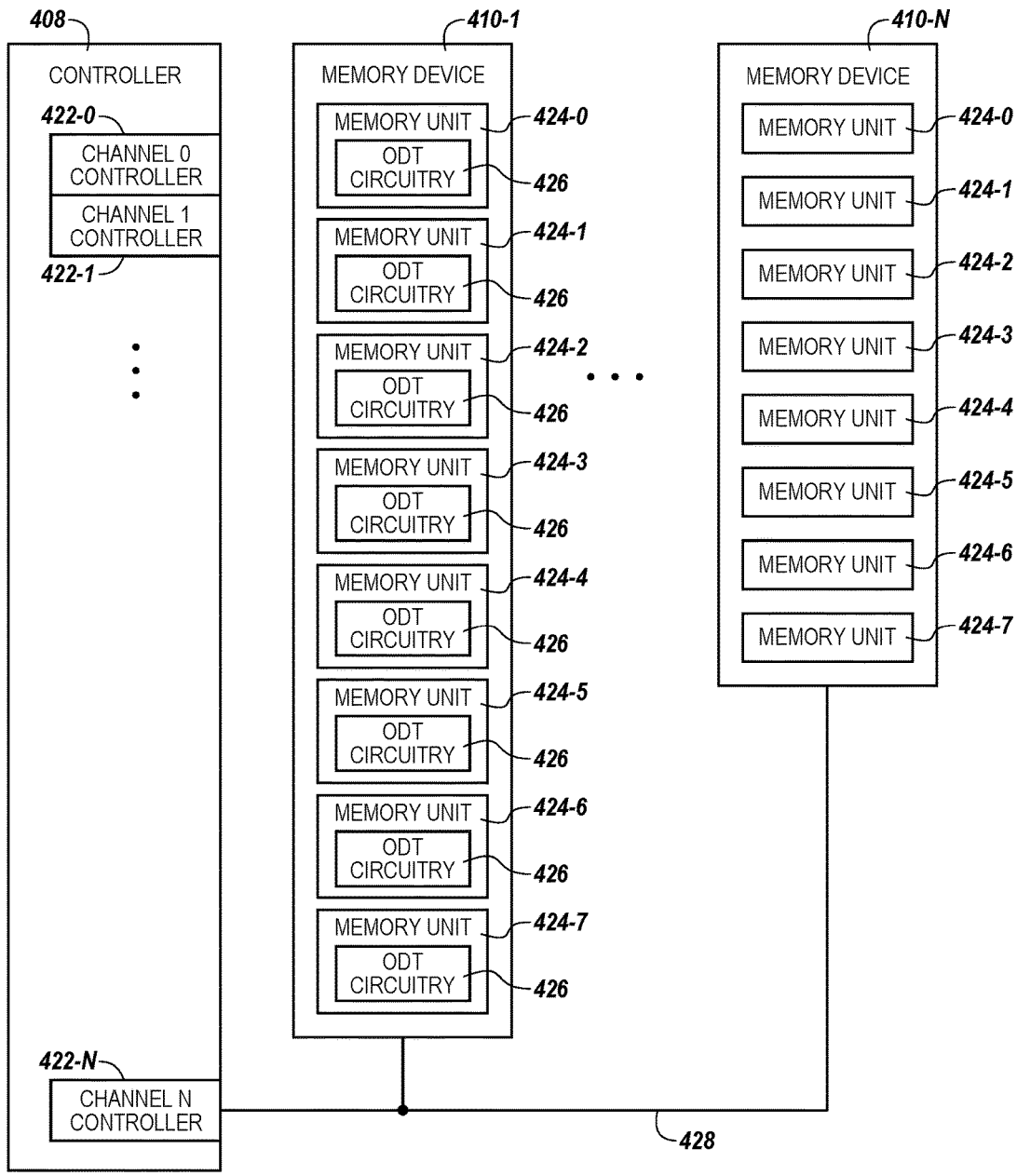
FIG. 4 is a functional block diagram of a portion of a memory system in accordance with a number of embodiments of the present disclosure.

FIG. 4 is a functional block diagram of a portion of a memory system (e.g., memory system 104 previously described in connection with FIG. 1) in accordance with a number of embodiments of the present disclosure. The memory system illustrated in FIG. 4 includes a controller 408 coupled to a number of memory devices 410-1, . . . , 410-N via a bus 428. Controller 408 and memory devices 410-1, . . . , 410-N can be, for example, controller 108 and memory devices 110-1, . . . , 110-N, respectively, previously described in connection with FIG. 1. Bus 428 can be, for example, analogous to bus 228 previously described in connection with FIG. 2.

Controller 408 can control access across a number of memory channels. In the embodiment illustrated in FIG. 4, controller 408 includes a number of channel controllers 422-0, 422-1, . . . , 422-N each controlling access to a respective memory channel. For example, in the embodiment illustrated in FIG. 4, channel controller 422-N is coupled to memory devices 410-1, . . . , 410-N via bus 428.

As shown in FIG. 4, memory devices 410-1, . . . , 410-N can include a number of (e.g., eight) memory units 424-0 to 424-7 that can provide a storage volume for the memory system. Memory units 424-0 to 424-7 can be, for example, analogous to memory units 224-0 to 224-7 previously described in connection with FIG. 2.

As shown in FIG. 4, each memory unit 424-0 to 424-7 of at least one of memory devices 410-1, . . . , 410-N includes on die termination (ODT) circuitry, and each memory unit 424-0 to 424-7 of at least one of memory devices 410-1, . . . , 410-N does not include ODT circuitry. For example, in the embodiment illustrated in FIG. 4, each memory unit 424-0 to 424-7 of memory device 410-1 includes ODT circuitry 426, and none of memory units 424-0 to 424-7 of memory device 410-N include ODT circuitry.

ODT circuitry 426 can be analogous to ODT circuitry 226 previously described in connection with FIG. 2. For example, ODT circuitry 426 of memory units 424-0 to 424-7 of memory device 410-1 can perform termination for a number of signal lines of bus 428 associated with memory devices 410-1, . . . , 410-N in a manner analogous to that previously described in connection with FIG. 2. In a number of embodiments, ODT circuitry 426 can perform target and/or non-target termination.

In a number of embodiments, a memory device that includes ODT circuitry may have a higher capacitance than a memory device that does not include ODT circuitry. Accordingly, because none of memory units 424-0 to 424-7 of memory device 410-N include ODT circuitry, memory device 410-N may have a lower capacitance than memory device 410-1. The lower capacitance of memory device 410-N can reduce the capacitance of the memory system as compared with previous approaches (e.g., approaches in which all memory devices of a memory system include enabled or disabled ODT circuitry), and hence can increase the operation speed (e.g., the input/output speed) of the memory system as compared with previous approaches.

ODT circuitry 426 of memory units 424-0 to 424-7 of memory device 410-1 can perform termination for memory units 424-0 to 424-7 of memory device 410-N. Since all memory units in a particular memory device either do or do not include ODT circuitry, different types of dies may not need to be mixed during the manufacture of the memory system illustrated in FIG. 4, which can simplify the manufacturing process.

In a number of embodiments, memory units 424-0 to 424-7 of memory device 410-1 can provide electrostatic discharge (ESD) protection for other memory units of other memory devices (e.g., memory device 410-N). That is, memory units 424-0 to 424-7 of memory device 410-1 can provide shared ESD protection among memory units 424-0 to 424-7 of memory device 410-N. In a number of embodiments, memory units 424-0 to 424-7 of memory device 410-N can also provide ESD protection for other memory units of other memory devices. For example, in a number of embodiments, the memory units of memory device 410-N may provide at least comparatively reduced on-die ESD protection for other memory units of other memory devices as compared with the ESD protection provided for the other memory units by memory device 410-N, which can further reduce the capacitance of memory device 410-N.

Figure 5:
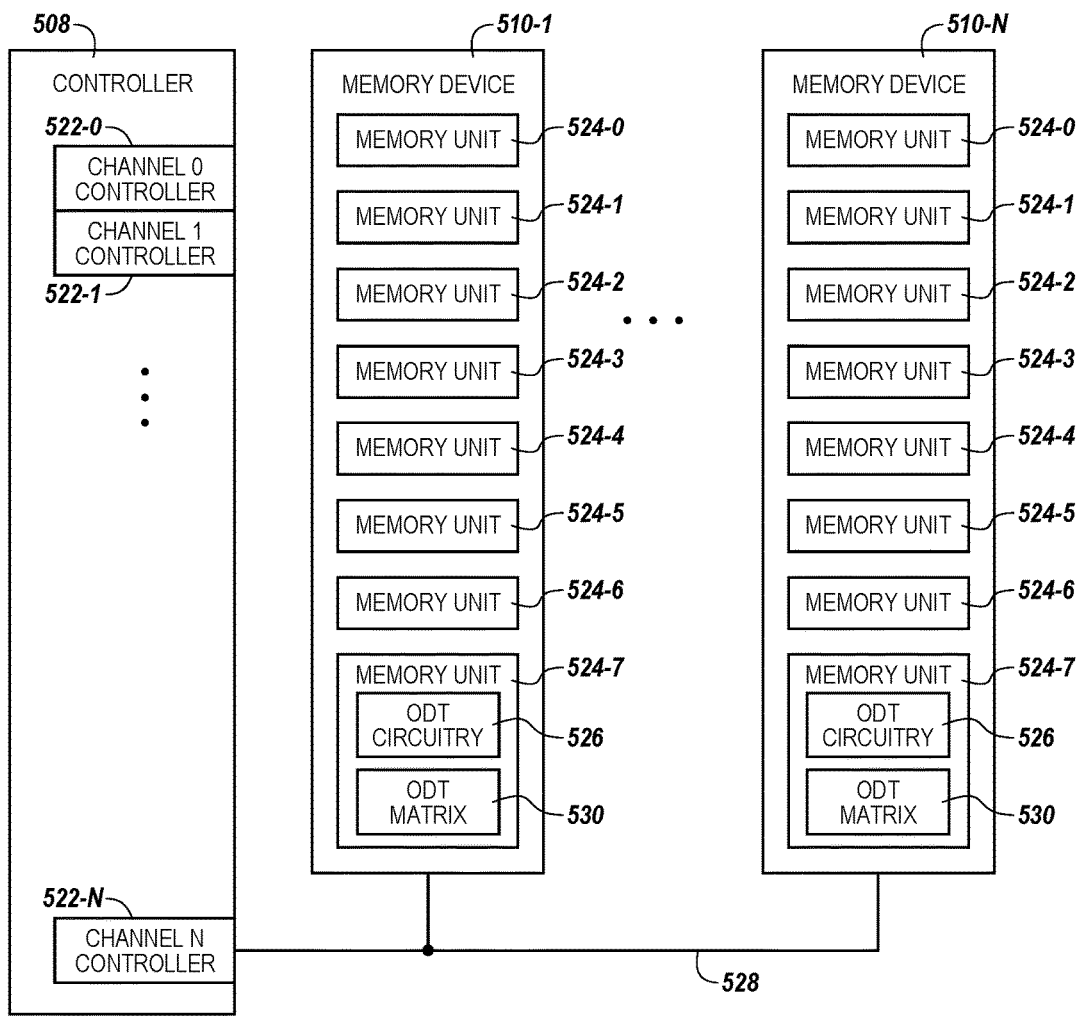
FIG. 5 is a functional block diagram of a portion of a memory system in accordance with a number of embodiments of the present disclosure.

FIG. 5 is a functional block diagram of a portion of a memory system (e.g., memory system 104 previously described in connection with FIG. 1) in accordance with a number of embodiments of the present disclosure. The memory system illustrated in FIG. 5 includes a controller 508 coupled to a number of memory devices 510-1, . . . , 510-N via a bus 528. Controller 508 and memory devices 510-1, . . . , 510-N can be, for example, controller 108 and memory devices 110-1, . . . , 110-N, respectively, previously described in connection with FIG. 1. Bus 528 can be, for example, analogous to bus 228 previously described in connection with FIG. 2.

Controller 508 can control access across a number of memory channels. In the embodiment illustrated in FIG. 5, controller 508 includes a number of channel controllers 522-0, 522-1, . . . , 522-N each controlling access to a respective memory channel. For example, in the embodiment illustrated in FIG. 5, channel controller 522-N is coupled to memory devices 510-1, . . . , 510-N via bus 528.

As shown in FIG. 5, memory devices 510-1, . . . , 510-N can include a number of (e.g., eight) memory units 524-0 to 524-7 that can provide a storage volume for the memory system. Memory units 524-0 to 524-7 can be, for example, analogous to memory units 224-0 to 224-7 previously described in connection with FIG. 2.

As shown in FIG. 5, at least one of memory units 524-0 to 524-7 of memory devices 510-1, . . . , 510-N includes on die termination (ODT) circuitry and an ODT matrix, and at least one of memory units 524-0 to 524-7 does not include ODT circuitry or an ODT matrix. For example, in the embodiment illustrated in FIG. 5, only memory unit 524-7 includes ODT circuitry 526 and ODT matrix 530 (e.g., none of memory units 524-0 to 524-6 include ODT circuitry or an ODT matrix).

ODT circuitry 526 can be analogous to ODT circuitry 226 previously described in connection with FIG. 2. For example, ODT circuitry 526 can perform termination for a number of signal lines of bus 528 associated with memory devices 510-1, . . . , 510-N in a manner analogous to that previously described in connection with FIG. 2.

ODT matrix 530 can include a number of ODT values for a number of timing modes associated with memory devices 510-1, . . . , 510-N (e.g., a number of timing modes at which memory devices 510-1, . . . , 510-N may operate). As an example, each of the number of ODT values in ODT matrix 530 can be for a different timing mode associated with memory devices 510-1, . . . , 510-N. An ODT value can be, for example, a resistance value associated with ODT circuitry 526 (e.g., a resistance value of the resistors of ODT circuitry 526). A timing mode associated with memory devices 510-1, . . . , 510-N can include, for example, an input/output speed and/or a clock frequency associated with the memory devices, and/or a bus speed associated with bus 528.

In a number of embodiments, controller 508 (e.g., channel controller 522-N) can adjust a timing mode associated with memory devices 510-1, . . . , 510-N (e.g., controller 508 can adjust the timing mode at which memory devices 510-1, . . . , 510-N are operating). For example, controller 508 can adjust the timing mode associated with memory devices 510-1, . . . , 510-N to a timing mode that permits memory devices 510-1, . . . , 510-N to consume a minimum amount of power while operating. Memory devices 510-1, . . . , 510-N (e.g., memory unit 524-7 having ODT circuitry 526) can then adjust ODT circuitry 526 (e.g., the ODT value of ODT circuitry 526) using ODT matrix 530 based, at least partially, on the adjustment of the timing mode associated with the memory devices. For example, memory devices 510-1, . . . , 510-N can determine, using ODT matrix 530, the ODT value for the adjusted timing mode, and then adjust (e.g., change) the ODT value of ODT circuitry 526 to the determined ODT value for the adjusted timing mode.

As an example, if controller 508 increases the input/output speed associated with memory devices 510-1, . . . , 510-N, memory devices 510-1, . . . , 510-N may increase the ODT value of ODT circuitry 526 (e.g., increase the resistance value associated with ODT circuitry 526). If controller 508 decreases the input/output speed associated with memory devices 510-1, . . . , 510-N, memory devices 510-1, . . . , 510-N may decrease the value of ODT circuitry 526. As an additional example, if controller 508 adjusts the input/output speed associated with memory devices 510-1, . . . , 510-N to a speed for which ODT is not needed, memory devices 510-1, . . . , 510-N may disable (e.g., turn off) ODT circuitry 526.

In a number of embodiments, memory devices 510-1, . . . , 510-N may adjust the ODT value of ODT circuitry 526 to a minimum resistance value that permits memory devices 510-1, . . . , 510-N to operate at the input/output speed of the adjusted timing mode. Such an adjustment of ODT circuitry 526 may result in decreased power consumption by the memory system as compared to previous approaches. Additionally, because ODT matrix 530 is included in memory devices 510-1, . . . , 510-N, the memory system may have decreased latency as compared to previous approaches (e.g., approaches in an ODT matrix is included in the controller of a memory system).

Although in the embodiment illustrated in FIG. 5 a single memory unit of memory devices 510-1, . . . , 510-N includes ODT circuitry and an ODT matrix, embodiments of the present disclosure are not so limited. For example, in a number of embodiments, two (or more) memory units of memory devices 510-1, . . . , 510-N can include ODT circuitry and an ODT matrix, in a manner analogous to that previously described in connection with FIG. 3. As an additional example, in a number of embodiments, each memory unit of at least one of memory devices 510-1, . . . , 510-N can include ODT circuitry and an ODT matrix, and each memory unit of at least one of memory devices 510-1, . . . , 510-N may not include ODT circuitry or an ODT matrix, in a manner analogous to that previously described in connection with FIG. 4. Still further, in a number of embodiments, each memory unit of each memory device can include ODT circuitry and an ODT matrix.

CONCLUSION

The present disclosure includes devices, methods, and systems supporting on unit termination. A number of embodiments include a number of memory units, wherein a memory unit includes termination circuitry, and a memory unit does not include termination circuitry.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a number of memory devices, wherein each of the number of memory devices includes a number of memory units, wherein:
 a memory unit of each respective memory device includes termination circuitry and a termination matrix, wherein:
  the termination circuitry includes a number of different selectable resistors; and
  the termination matrix includes a number of resistance values associated with the termination circuitry for a number of different input/output speeds, clock frequencies, and bus speeds associated with the number of memory devices, wherein each of the number of resistance values represents a different one of the number of input/output speeds, clock frequencies, and bus speeds associated with the number of memory devices; and
 a memory unit of each respective memory device does not include termination circuitry.

2. The system of claim 1, wherein the termination circuitry is configured to monitor commands provided across a bus of the number of memory devices.

3. The system of claim 1, wherein the termination circuitry is configured to perform a termination function upon detection of a particular command provided across a bus of the number of memory devices.

4. The system of claim 3, wherein the termination circuitry is configured to de-activate upon performing the termination function.

5. The system of claim 3, wherein the system includes a controller configured to adjust a timing mode associated with the number of memory devices.

6. The system of claim 5, wherein the memory unit of each respective memory device that includes the termination circuitry and the termination matrix is configured to adjust the termination circuitry based, at least partially, on the adjustment of the timing mode.

7. A method of operating a system, comprising:
adjusting a timing mode associated with a number of memory devices of the system, wherein:
 each of the number of memory devices includes a number of memory units;
 a memory unit of each respective memory device includes termination circuitry and a termination matrix, wherein the termination matrix includes a number of resistance values associated with the termination circuitry for a number of different input/output speeds, clock frequencies, and bus speeds associated with the number of memory devices, wherein each of the number of resistance values represents a different one of the number of input/output speeds, clock frequencies, and bus speeds associated with the number of memory devices; and
 a memory unit of each respective memory device does not include termination circuitry;
adjusting the termination circuitry of the memory unit of at least one of the number of memory devices based, at least partially, on the adjustment of the timing mode;
monitoring, by the termination circuitry, commands provided across a bus of the number of memory devices;
activating, by the termination circuitry, upon detection of a particular command to perform a termination function; and
de-activating, by the termination circuitry, upon performing the termination function.

8. The method of claim 7, wherein the method includes:
adjusting the timing mode using a controller of the system; and
adjusting the termination circuitry using the memory unit of the at least one of the number of memory devices.

9. The method of claim 7, wherein adjusting the termination circuitry includes increasing or decreasing a resistance value associated with a number of selectable resistors of the termination circuitry.

10. The method of claim 9, wherein increasing or decreasing the resistance value associated with the number of selectable resistors includes increasing or decreasing the resistance value to a minimum resistance value that permits the number of memory devices to operate at an input/output speed of the adjusted timing mode.

11. The method of claim 7, wherein adjusting the termination circuitry includes turning the termination circuitry off.

12. The method of claim 7, wherein adjusting the timing mode includes adjusting an input/output speed associated with the number of memory devices.

13. The method of claim 7, wherein adjusting the timing mode includes adjusting a clock frequency associated with the number of memory devices.

14. The method of claim 7, wherein adjusting the timing mode includes adjusting a bus speed associated with the bus of the number of memory devices.

15. A system, comprising:
a number of memory devices, wherein each of the number of memory devices includes a number of memory units, wherein:
 a memory unit of each respective memory device includes termination circuitry and a termination matrix, wherein:
  the termination circuitry includes a number of different selectable resistors;
  the termination matrix includes a number of resistance values associated with the termination circuitry for a number of different input/output speeds, clock frequencies, and bus speeds associated with the number of memory devices, wherein each of the number of resistance values represents a different one of the number of input/output speeds, clock frequencies, and bus speeds associated with the number of memory devices; and the termination circuitry is configured to:
monitor commands provided across a bus of the number of memory devices;
activate upon detection of a particular command to perform a termination function; and
de-activate upon performing the termination function; and a memory unit of each respective memory device does not include termination circuitry.

16. The system of claim 15, wherein the system includes a controller coupled to the number of memory devices, wherein the controller is configured to control access across a number of memory channels coupled to the respective number of memory devices via the bus.

17. The system of claim 15, wherein only one or only two memory units of each respective memory device include the termination circuitry and the termination matrix.

18. The system of claim 15, wherein:
the memory unit of each respective memory device that includes the termination circuitry and the termination matrix is configured to provide electrostatic discharge protection for the memory unit of that respective memory device that does not include termination circuitry; and the memory unit of each respective memory device that does not include termination circuitry is configured to provide electrostatic discharge protection for the memory unit of that respective memory device that does not include termination circuitry.

19. The system of claim 15, wherein:
the memory unit of each respective memory device includes the termination circuitry and a termination matrix is a die; and the termination circuitry is on die termination circuitry.

20. The system of claim 15, wherein:
only one memory unit of each respective memory device includes the termination circuitry and the termination matrix; and a plurality of memory units of each respective memory device does not include termination circuitry.

* * * * *